US005952060A

United States Patent [19]
Ravi

[11] Patent Number: 5,952,060
[45] Date of Patent: Sep. 14, 1999

[54] USE OF CARBON-BASED FILMS IN EXTENDING THE LIFETIME OF SUBSTRATE PROCESSING SYSTEM COMPONENTS

[75] Inventor: Kramadhati Ravi, Atherton, Calif.

[73] Assignee: Applied Materials, Inc., Santa Clara, Calif.

[21] Appl. No.: 08/664,948

[22] Filed: Jun. 14, 1996

[51] Int. Cl.$^6$ .............................. B01J 19/02; H05H 1/00
[52] U.S. Cl. ...................... 427/577; 118/722; 118/723 R; 134/1.2; 422/241; 427/249
[58] Field of Search .......................... 422/241; 134/1.1, 134/1.2; 118/722, 723 R, 728, 504; 156/345; 427/249, 577; 216/46.67; 204/192.1, 192.16, 192.32, 298.11, 298.31

[56] References Cited

U.S. PATENT DOCUMENTS

| | | | |
|---|---|---|---|
| 4,551,192 | 11/1985 | Di Milla et al. | 156/345 |
| 4,816,113 | 3/1989 | Yamazaki | 156/345 |
| 4,981,717 | 1/1991 | Thaler | 427/53.1 |
| 5,013,693 | 5/1991 | Guckel et al. | 437/248 |
| 5,021,138 | 6/1991 | Babu et al. | 204/298.33 |
| 5,166,856 | 11/1992 | Liporace et al. | 361/233 |
| 5,268,200 | 12/1993 | Steger | 427/249 |
| 5,283,087 | 2/1994 | Yamazaki et al. | 427/577 |
| 5,397,428 | 3/1995 | Stoner et al. | 117/86 |
| 5,411,758 | 5/1995 | Simpson | 427/8 |
| 5,413,360 | 5/1995 | Atari et al. | 361/234 |
| 5,431,968 | 7/1995 | Miller et al. | 427/577 |
| 5,436,790 | 7/1995 | Blake et al. | 361/234 |
| 5,463,526 | 10/1995 | Mundt | 361/234 |
| 5,548,470 | 8/1996 | Husain et al. | 361/234 |
| 5,622,565 | 4/1997 | Ye et al. | 118/723 R |

FOREIGN PATENT DOCUMENTS

| | | |
|---|---|---|
| 4-349197 | 12/1992 | Japan . |
| 5-121365 | 5/1993 | Japan . |
| 5-144929 | 6/1993 | Japan . |
| 6-107494 | 4/1994 | Japan . |

OTHER PUBLICATIONS

Translation of Japanese Patent Application 05–121,365 (Omori et al), May 18, 1993.
Singer, "Electrostatic Chucks in Wafer Processing," Semiconductor International, Apr. 1995, pp. 57–64.

*Primary Examiner*—Jeffrey E. Russel
*Attorney, Agent, or Firm*—Townsend & Townsend & Crew

[57] ABSTRACT

An apparatus for processing substrates that includes a processing chamber having an interior surface at least partially coated with a carbon-based coating. The carbon-based coating protects the interior of the chamber from etching gases and other reactants used during substrate processing. The coating also resists accumulation of residues, does not generate particulates and seals in impurities residing in the coated materials. In preferred embodiments the carbon-based coating is either diamond or a diamond-like carbon (DLC) coating. Also described is a process for protecting a processing chamber's interior surface from the reactants used in substrate processing by coating at least portions of the surface with such a carbon-based coating.

43 Claims, 6 Drawing Sheets

USE OF CARBON-BASED FILMS IN EXTENDING THE LIFETIME OF SUBSTRATE PROCESSING SYSTEM COMPONENTS

CROSS-REFERENCE TO RELATED APPLICATIONS

This application is related to the patent entitled "METHOD AND APPARATUS FOR THE USE OF DIAMOND FILMS AS DIELECTRIC COATINGS ON ELECTROSTATIC CHUCKS," (U.S. Pat. No. 5,812,362), filed Jun. 14, 1996 as inventor. The above-referenced application is assigned to Applied Materials, Inc., the assignee of the present invention, and is hereby incorporated by reference.

BACKGROUND OF THE INVENTION

The present invention relates to the protection of surfaces exposed to reactants in substrate processing systems. More specifically, the present invention relates to a substrate processing apparatus having a carbon-based coating, such as diamond or diamond-like carbon (DLC), on surfaces exposed to reactants and a method for applying and maintaining such coatings.

The processing of substrates requires a carefully controlled environment to avoid contamination from ambient chemical species and defects caused by particulates. Therefore, substrate processing steps take place in the controlled environment of a processing chamber. These steps include operations such as deposition, etching, sputtering and diffusion. In the production of a finished substrate, each of these operations serves a function such as applying, patterning and manipulating the characteristics of the various layers required by the given technology during the course of manufacturing semiconductor devices and circuits.

Some of the gases used during substrate processing are especially corrosive, and tend to etch material from the processing chamber's interior surfaces. Thus, one of the difficulties confronting users of substrate processing systems is the etching experienced by components exposed to reactants. Attack of these components is particularly severe during etching and cleaning procedures. For example, as a film is deposited on a substrate, some of the material being deposited also accumulates on the processing chamber's walls and must be removed periodically. This removal is done during cleaning operations in which process gases are evacuated from the processing chamber and an etchant gas such as $CF_4$ or $NF_3$ is introduced. A plasma is then formed from the etchant gas in order to etch away residues accumulated on the processing chamber's interior. Such cleanings may be required as frequently as every one to three substrates.

Unfortunately, etching of the processing chamber's components often occurs during such cleaning. A fundamental reason for the over-etching experienced by certain interior surfaces is the varying thickness of the accumulated residues. Some of the chamber's interior surfaces accumulate more residue due to their location, their constituent materials and other factors. The cleaning step, however, generally continues until substantially all residues are removed from the processing chamber's interior surfaces. Thus, some surfaces will become residue-free before others. Over-etching occurs when these residue-free surfaces (and those which do not experience residue accumulation) are exposed to constituents from the etchant plasma.

Poor resistance to the cleaning process and other corrosive operations (such as etching) is a limiting factor in terms of machine reliability (i.e., shortened component lifetime). Over-etching of the interior surface of the processing chamber or other components reduces the useful lifetime of such components, decreases substrate throughput as the worn out components are replaced, increases the cost of consumables, and may lead to particle contamination. Furthermore, this lack of etch resistance limits methods of enhancing machine productivity, such as increasing the cleaning rate (e.g., by the use of higher RF power in the cleaning operation).

Accordingly, it is desirable and important to extend the lifetime of processing chamber components that come into contact with the reactants used in substrate processing systems. Resistance to the etchants employed in substrate processing systems is thus desirable. The accumulation of residues should also be reduced to the extent feasible, as should the release of particulates. Finally, the release of impurities from the processing chamber's components should be minimized.

SUMMARY OF THE INVENTION

The present invention addresses these requirements by coating those components exposed to the reactants used in substrate processing systems with a carbon-based material. Such a carbon-based material includes, for example, diamond and/or diamond-like carbon (DLC). The carbon coating is resistant to the reactants used in substrate processing systems, and thus extends the lifetime of processing chamber components. The coating also reduces the accumulation of residues and reduces the release of particulates and impurities during processing from coated components.

The apparatus of the present invention includes a housing having an interior surface, which defines a processing chamber and which encloses a substrate holder. The chamber's interior surface is at least partially coated with a carbon-based coating. Ideally, the surfaces coated are those that are exposed to reactants and subject to etching during substrate processing operations. In preferred embodiments, the carbon-based coating is either diamond or DLC.

In another preferred embodiment, the carbon-based coating is applied and periodically reapplied in an in situ process between substrate processing steps. In this embodiment, the coating is deposited by first evacuating any process gases that might remain in the processing chamber. Next, one or more coating process gases are introduced into the processing chamber. A plasma is then formed to deposit a carbon-based coating on the processing chamber's inner surface. Once a carbon-based coating has been deposited in the required thickness, the coating process gases are evacuated from the processing chamber. Usual substrate processing steps are then performed in the chamber, and the steps for applying the carbon-based coating are repeated periodically as appropriate.

A further understanding of the nature and advantages of the present invention may be realized by reference to the remaining portions of the specification and the drawings.

DETAILED DESCRIPTION OF THE PREFERRED EMBODIMENTS

I. Introduction

The present invention extends the lifetime of substrate processing systems by coating surfaces exposed to reactants with a carbon-based material such as diamond and/or diamond-like carbon (DLC). Both diamond and DLC coatings are resistant to etching by the reactants commonly employed in substrate processing systems and resist the formation of residues. Additionally, diamond and DLC coatings reduce particulates and act as barriers to the diffusion of impurities from the materials coated.

A carbon-based coating may be applied in several different ways. First, individual components may be coated prior to installation. Techniques for coating such components in this manner include processes such as hot-filament CVD (HFCVD), where process gases, ionized by heated filaments, deposit a carbon-based coating on the component. A microwave enhanced CVD (MECVD) process may also be used. In the MECVD process, a process gas, ionized by RF energy, is used to deposit a carbon-based coating on a component placed inside the ionized process gas (i.e., plasma).

It is also possible to coat such components after they are already installed in the chamber, using an in situ process. This method periodically deposits a carbon-based coating by creating a plasma within one or more coating process gases introduced into the processing chamber. The operation is repeated periodically to replenish the carbon-based coating that may be etched away during substrate processing.

II. An Exemplary HDP-CVD System

The present invention is applicable to substantially all substrate processing systems, including, for example, etching systems, CVD systems, sputtering systems and diffusion systems. One such substrate processing system is the HDP-CVD system illustrated in FIG. 1 and described below. The plasma formed in HDP-CVD systems is generally denser, and therefore more highly reactive, than the plasma formed in standard capacitively-coupled plasma enhanced CVD (PECVD) systems. Thus, components of such HDP-CVD systems are particularly susceptible to over-etching.

Figure 1:
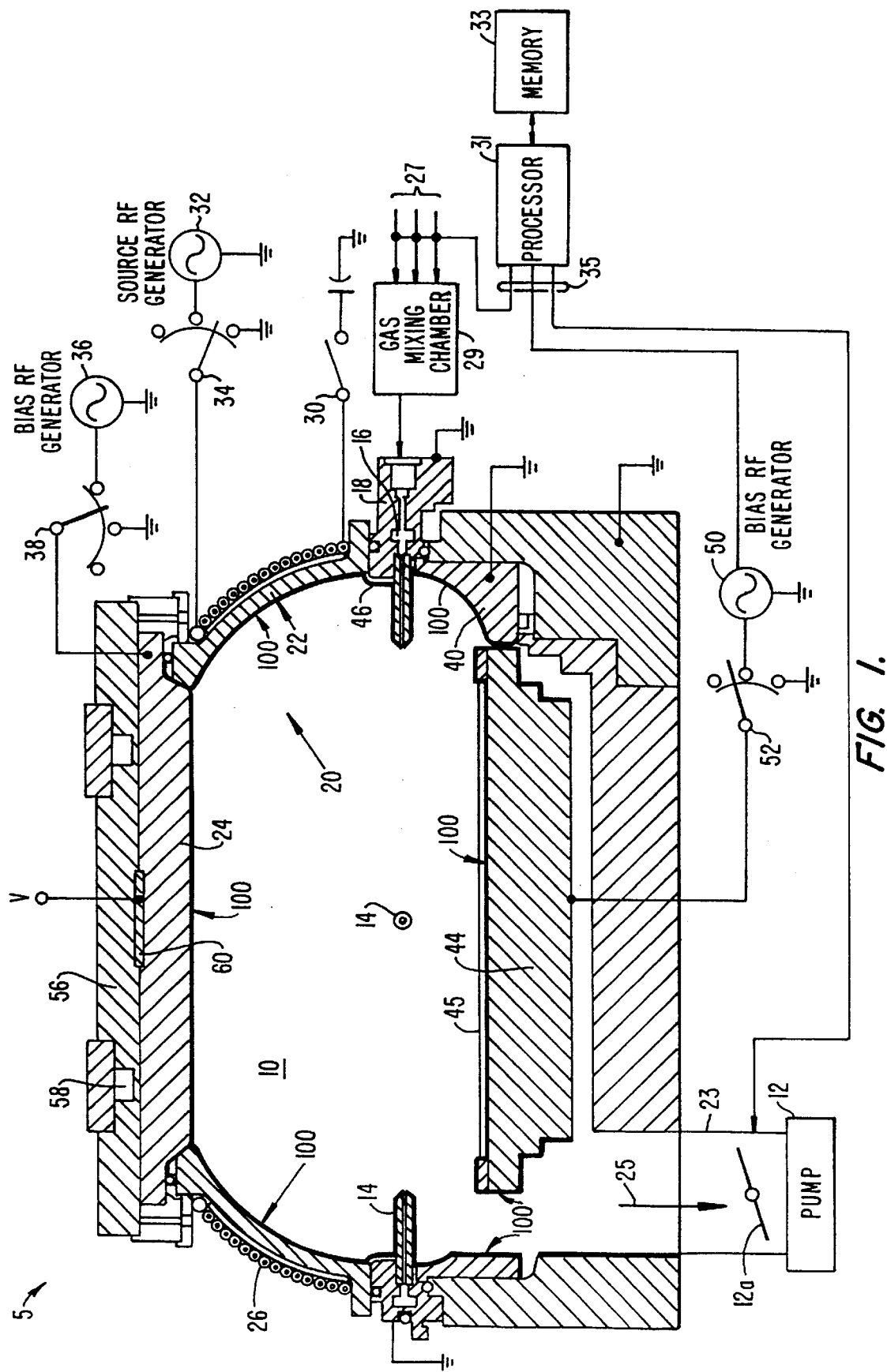
FIG. 1 is a vertical, cross-sectional view of one embodiment of a simplified high-density plasma-chemical vapor deposition (HDP-CVD) apparatus having a carbon-based coating on the interior surface of vacuum chamber 10 according to the present invention.

As illustrated in FIG. 1, an HDP-CVD system 5 includes a vacuum chamber 10, a vacuum pump 12, a bias RF (BRF) generator 36, a BRF generator 50 and a source RF (SRF) generator 32. Vacuum chamber 10 includes a ceiling 20 consisting of a sidewall 22 and a disk-shaped ceiling electrode 24. Sidewall 22 is made of an insulator such as quartz or ceramic, and supports coiled antenna 26. The structural details of coiled antenna 26 are disclosed in U.S. Pat. No. 5,614,055 entitled "High Density Plasma CVD and Etching Reactor," by Fairbain and Nowak, filed Aug. 27, 1993, the disclosure of which is incorporated herein by reference.

Deposition gases and liquids are supplied through lines 27, having control valves (not shown), into a gas mixing chamber 29 where they are combined and sent to a gas supply ring manifold 16. Gas injection nozzles 14 are coupled to gas supply ring manifold 16 and disperse deposition gases introduced into manifold 16 to a substrate 45 resting on a pedestal 44 within chamber 10. Pedestal 44 may contain an electrostatic chuck or similar mechanism to restrain the substrate during processing, and may also contain cooling passages and other features.

Gas supply ring manifold 16 is positioned within a housing 18. Housing 18 is protected from reactants by a skirt 46. Skirt 46 is composed of a material, such as quartz, ceramic, silicon or polysilicon, which is resistant to the reactants used in the HDP-CVD process. The bottom of vacuum chamber 10 may include an annular liner 40, which itself may be removable.

An inductively coupled plasma of the deposition gases can be formed adjacent to substrate 45 by RF energy applied to coiled antenna 26 from SRF generator 32. SRF generator 32 can supply either single or mixed frequency RF power (or other desired variation) to coiled antenna 26 to enhance the decomposition of reactive species introduced into vacuum chamber 10. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depend upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increases the gap-fill capability of a film).

Capacitive coupling may also be used to form the plasma separately from, or in conjunction with, the formation of an inductively coupled plasma. A capacitively coupled plasma may be formed between ceiling electrode 24 and pedestal 44. In this configuration, ceiling electrode 24 and pedestal 44 each act as one plate of a parallel-plate capacitor. The capacitively coupled plasma is formed between these two plates.

BRF generators 36 and 50, SRF generator 32, throttle valve 12a, the control valves connected to lines 27, switches 30, 34, 38 and 52, and other elements in HDP-CVD system 5 are all controlled by a processor 31 over control lines 35, only some of which are shown. Processor 31 operates under the control of a computer program stored in a computer-readable medium such as a memory 33. The computer program dictates the timing, mixture of gases, chamber pressure, RF power levels and other parameters of a particular process.

An example of such an HDP-CVD apparatus, along with the details of each of the capacitively coupled configurations and the specific details concerning the inductively coupled configurations, is described in U.S. patent application Ser. No. 08/234,746, filed Apr. 26, 1994, now abandoned, subject of file wrapper continuation application Ser. No. 08/766,053, filed Dec. 16, 1996, now U.S. Pat. No. 5,865,896, issued Feb. 2, 1999 entitled "High Density Plasma CVD Reactor with Combined Inductive and Capacitive Coupling," the disclosure of which is incorporated herein by reference.

As previously stated, the above description is for illustrative purposes only and should not be considered as limiting the scope of the present invention. Variations of the above-described system, such as variations in pedestal design, chamber design, location of RF power connections and other variations are possible. Additionally, other systems such as etching systems, diffusion systems, electron cyclotron resonance (ECR) plasma CVD devices, thermal CVD devices, PECVD systems, sputtering systems or the like, can enjoy the benefits of the present invention. The method and apparatus of the present invention are not limited to any specific substrate processing system.

III. Types of Carbon-Based Protective Coatings

A. Diamond Coatings

In one embodiment of the present invention a diamond coating is applied to processing chamber components exposed to reactants during substrate processing. As illustrated by a carbon-based coating 100 in FIG. 1, a diamond coating may be applied to any component forming the interior surface of vacuum chamber 10. For example, such a coating may be deposited on quartz components (e.g., sidewall 22 or pedestal 45) and silicon components (e.g., ceiling electrode 24). The coating may also be applied to gas injection nozzles and to other components. The coating of components such as the sidewall, pedestal or electrode is particularly desirable due to the combination of their cost and susceptibility to over-etching during the cleaning process.

A pinhole-free, high-quality diamond coating can be deposited on silicon, quartz and other materials used to form the housing of vacuum chamber 10. Such a coating can be deposited on a component in a variety of ways, such as by CVD processing (e.g., PECVD or hot filament CVD (HFCVD)).

For example, an HFCVD system may be used to apply a diamond coating according to the present invention. Such a deposition system includes a quartz or stainless steel processing chamber enclosing a temperature-controlled component platform and several refractory-metal filaments forming of a two-dimensional array. The filaments are positioned approximately 1 inch above the component being coated. The deposition process begins by placing the component on the component platform. The processing chamber is then evacuated through the use of an appropriate vacuum pump. A process gas is introduced into the processing chamber by gas nozzles positioned above the filament array. This process gas typically includes about 1% $CH_4$ and about 99% $H_2$, but other gases and ratios may be employed. RF energy of between about 1000 Watts and 2000 Watts is then applied to the filaments, heating the filaments and causing the emission of electrons. The filament array's high temperature and the electrons emitted cause the process gas flowing past the filaments to dissociate (i.e., ionize). The creation of methyl radicals and atomic hydrogen in this plasma results in the deposition of a diamond film on the component. The process continues until the deposited coating reaches the selected thickness, which may be between about 1 $\mu$m and 50 $\mu$m, but is preferably between about 2 $\mu$m and 5 $\mu$Am. An HFCVD process of this type typically employs a deposition temperature of about 800° C. and a processing chamber pressure of about 20 torr. The flow rate of the process gas is kept between about 100 sccm and 200 sccm.

Such a coating possesses characteristics comparable to, and, in some cases, better than those exhibited by natural diamond. It adheres well to materials such as silicon and quartz and exhibits good thermal and mechanical stability during thermal cycling. Diamond-coated components also resist chemical attack, including attack by ionized gaseous species such as those present in the exemplary HDP-CVD system during deposition and cleaning steps.

Contaminants and deposits (e.g., silicon oxide) do not nucleate readily on the surfaces of components coated according to the present invention, due to the high surface-energy level of the diamond coating. It is believed, therefore, that oxide deposits will form at a slower rate on coated components than on silicon or quartz surfaces. This will allow more deposition cycles between cleaning steps. Additionally, the lack of any reaction between the deposits and the component's coating should lead to enhanced cleaning rates.

With regard to contamination, impurities exhibit negligible solubility and diffusion rates in the surfaces of components coated according to the present invention. Systems using such components thus provide an inherently cleaner environment than systems employing uncoated components. Additionally, such components are coated using processes conducted at temperatures in excess of 700° C., and in the presence of a high concentration of atomic hydrogen. Thus, device-damaging impurities such as alkali metals and heavy metals are excluded. Impurities that do exist in a component coated accordingly to the present invention are also precluded from diffusing out of the component.

The coated components' resistance to etching also translates into longer cleaning intervals in substrate processing systems requiring such operations. Once residues are etched away, the diamond coating prevents etching of the now residue-free surfaces. Regions of the chamber that require longer cleaning times can thus be cleaned without over-etching residue-free chamber surfaces.

Moreover, if all exposed processing chamber components are diamond-coated, it is possible to use an end-point detection system for monitoring the cleaning process in systems currently unable to use such techniques, such as HDP-CVD. In systems presently capable of such monitoring, a comparatively rapid change in the processing chamber's environment occurs when the cleaning process completes. However, no such change occurs in some substrate processing systems. In the exemplary HDP-CVD system described above, for example, the by-products of cleaning detectable in the processing chamber's environment contain compounds such as fluorides and oxides of silicon. The etching of HDP-CVD processing chamber components (typically made of quartz) also generates such compounds. Thus, no change in the processing chamber's environment is detected when the residues are etched away and the chamber's interior begins to etch. However, as components coated according to the present invention will not etch appreciably, generation of such compounds will cease once the residues have been removed. Thus, by using emission spectroscopy, laser-induced fluorescence or a comparable method, completion could be definitively detected and the cleaning operation controlled appropriately.

B. Diamond-Like Carbon Coatings

In an alternative embodiment, carbon-based coating 100 is a diamond-like carbon (DLC). Also termed "amorphous carbon," "hard carbon" or "α carbon," DLC is an amorphous material with many, but not all, the properties of diamond. Like diamond, DLC is a dielectric material and is chemically inert. DLC possesses up to about 80% of diamond's hardness. DLC differs from diamond in that DLC is an amorphous material. Diamond's crystalline atomic structure exhibits short- and long-range order, meaning that a given atom's neighbors may be found at predictable angles and distances from that atom. In contrast, the atomic structure of DLC exhibits no such order. An atom's neighbors are distributed randomly in DLC's atomic amorphous structure. The degree of irregularity determines how nearly the DLC coating approximates a diamond coating. DLC also possesses a low thermal conductivity (unlike diamond's thermal conductivity, which is 5 times that of copper and over 13 times that of silicon).

An advantage of DLC-coated components is the comparatively low temperatures employed in the coating process, which can be below 200° C. This allows substrate processing systems that are unable to generate the high temperatures required by the diamond deposition process, to deposit a DLC coating. Also, currently available DLC coating techniques more easily allow large components to be coated than currently available diamond coating techniques. The deposition systems used to apply such coatings may employ ion beam deposition, parallel-plate RF deposition, laser ablation or other techniques, allowing surfaces to be coated that would otherwise be difficult to coat.

For example, the HFCVD system previously mentioned may be used to apply a DLC coating according to the present invention. The component is first placed in the HFCVD system's processing chamber, which is then evacuated. A process gas is introduced into the processing chamber. Typically, the process gas includes about 1% $CH_4$ and about 99% $H_2$, but other gases and ratios may be used. RF energy of between about 3000 Watts and 5000 Watts is then applied, ionizing the process gas. This plasma coats the component with DLC. Deposition continues until the deposited coating reaches a selected thickness, which may be between about 0.5 $\mu$m and 50 $\mu$m, but is preferably between about 0.5 $\mu$m and 2.0 $\mu$m. A DLC deposition process of this type typically employs a deposition temperature of between about 200° C. and 250° C. A selected pressure of between about 5 torr and 50 torr is maintained in the processing chamber. The flow rate of the process gas is kept between about 100 sccm and 500 sccm.

The DLC-coated components' durability is superior to that of uncoated components, such as those made of the silicon, quartz and other materials used in substrate processing systems. For example, DLC-coated components are subject to a lower rate of attack during substrate processing and cleaning operations. To avoid instability during deposition of the DLC coating, the surface temperature of a component being coated should be kept under about 300° C. At higher temperatures, flaking and oxidation may occur.

If necessary, used DLC-coated components may be recoated with a fresh DLC coating. This would be done, for example, following the erosion of a DLC coating caused by repeated cleaning cycles. The DLC coating's lifetime is a function of the component's surface temperature and partial pressures of reactants (e.g., activated oxygen and fluorine) present during the deposition of the DLC coating. As processing temperature is increased, the lifetime of the DLC coating decreases. Higher partial pressures of reactants such as activated oxygen and fluorine also shorten the DLC coating's lifetime.

C. In situ Synthesis of Carbon-Based Coatings

A further advantage of the present invention is the ability to form diamond and DLC coatings that line components of a substrate processing chamber within the chamber itself using an in situ process. For example, certain substrate processing systems (such as CVD systems) are capable of synthesizing DLC coatings. The in situ process uses this capability to periodically deposit a DLC layer on the interior surface of the system's processing chamber. The components need not be removed to apply this coating. This process is particularly relevant to DLC coatings, as such coatings are more easily applied by an in situ process than are similar diamond coatings.

For example, in the exemplary HDP-CVD system of FIG. 1, a hydrocarbon process gas could be introduced periodically to permit the formation of a DLC coating corresponding to carbon-based coating 100. The frequency with which this coating is reapplied would depend on the coating's thickness, the processing temperatures, the reactivity of the process gases and other factors. Typically, a DLC coating deposited by an in situ process according to the present invention is preferably between about 0.5 $\mu$m and 2 $\mu$m in thickness, whereas a diamond coating deposited ex situ according to the present invention will preferably be between about 2 $\mu$m and 5 $\mu$m in thickness.

Figure 2:
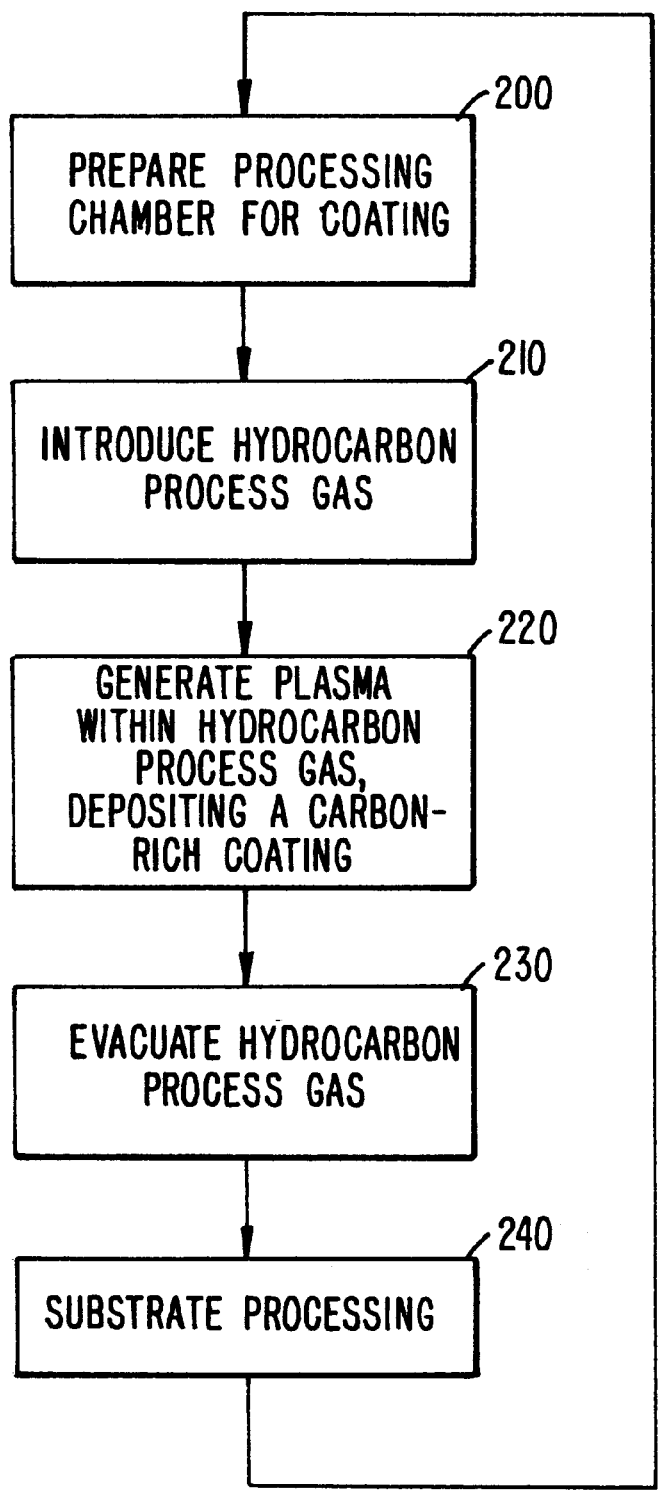
FIG. 2 is a flow chart illustrating the steps performed in applying a carbon-based coating using an in situ process according to the process of the present invention.

FIG. 2 illustrates a simplified flow chart demonstrating an embodiment of the present invention in which a carbon-based coating is deposited. The flow chart is described in terms of the exemplary HDP-CVD system shown in FIG. 1. In step 200, the processing chamber is prepared to receive carbon-based coating 100. For example, if carbon-based coating 100 were being reapplied, this might include evacuating all process gases remaining in vacuum chamber 10 from previous processing steps. In step 210, a hydrocarbon process gas is introduced into vacuum chamber 10. A plasma is subsequently created from the hydrocarbon process gas in step 220, depositing a carbon coating. Finally, the hydrocarbon process gas is evacuated from vacuum chamber 10 (step 230) and normal processing of substrates resumes (step 240). Normal processing may include such steps as etching, deposition, cleaning and diffusion.

For example, the coating process gas may include a mixture of a carbon-containing gas such as methane ($CH_4$) and a non-carbon-containing gas such as hydrogen ($H_2$), mixed in the ratio of 99% hydrogen and 1% methane. The coating process gas is introduced into the system's processing chamber at a rate of between about 100 sccm and 500 sccm. A selected pressure between about 5 torr and 50 torr in the system's processing chamber is maintained throughout deposition and the introduction of the coating process gas. Also, the temperature within the processing chamber is maintained at a temperature of between about 200° C. and 250° C. After processing conditions are set, RF energy is applied to form a plasma. RF energy is applied at between about 3000 Watts and 5000 Watts. Maintaining the plasma for a selected period under these conditions results in the formation of a carbon-based coating according to the present invention.

Figure 3:
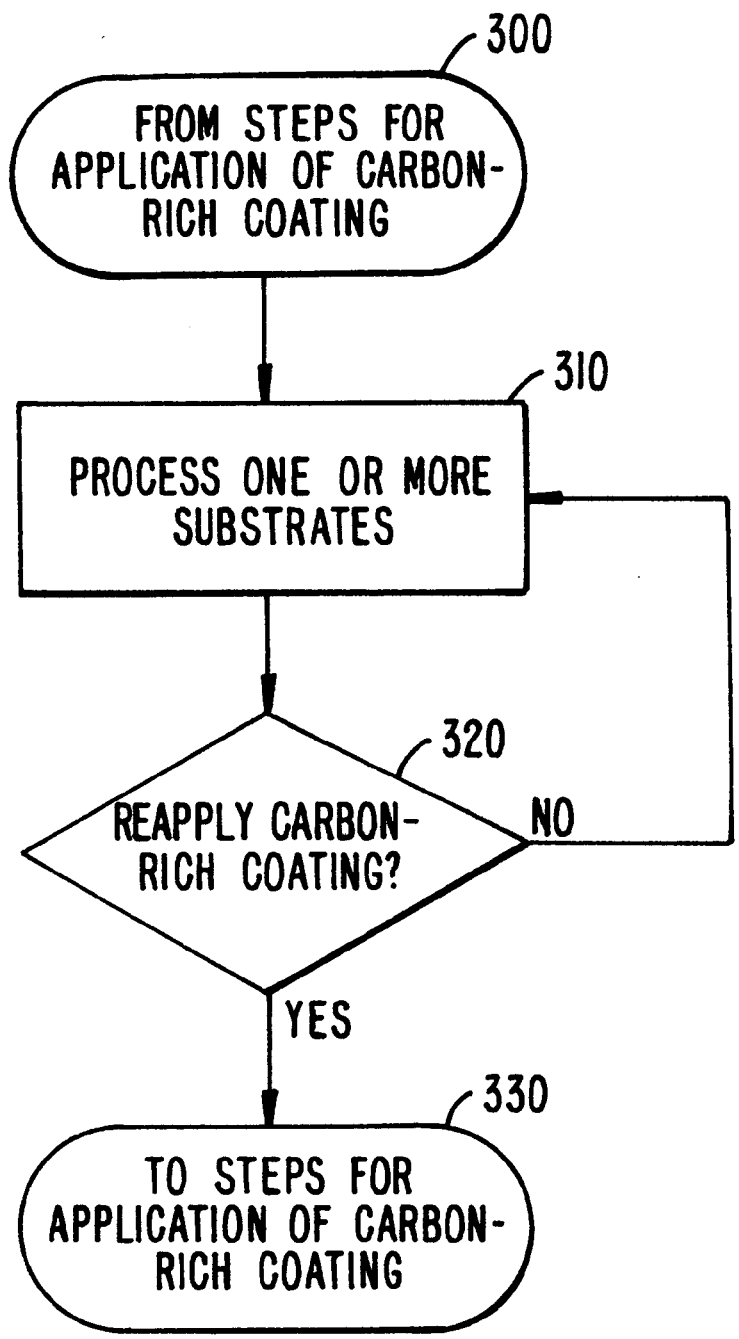
FIG. 3 is a flow chart illustrating the steps performed in processing a substrate using an in situ process according to one method of the present invention.

FIG. 3 illustrates a simplified flow chart of a processing sequence used to demonstrate an embodiment of the present invention. The processing sequence proceeds at step 300 from the deposition of carbon-based coating 100. In step 310, one or more substrates are processed. The decision as to whether to reapply a fresh carbon-based coating can be made in step 320 by the system's processor (e.g., processor 31 in the exemplary HDP-CVD system). The processor may base this decision on physical measurements of the remaining carbon-based coating, or on whether a predetermined number of substrates have been processed. For example, it is believed that between about 1 and 4 substrates could be processed in the exemplary HDP-CVD system before such a coating would need to be reapplied. Alternatively, the carbon-based coating could be reapplied when the coating's thickness is reduced to between about 0.1 $\mu$m and 1 $\mu$m, but would preferably be reapplied when the coating's thickness reached about 0.5 $\mu$m. Once this threshold has been reached, a fresh carbon-based coating is applied as indicated by step 330.

Figure 4:
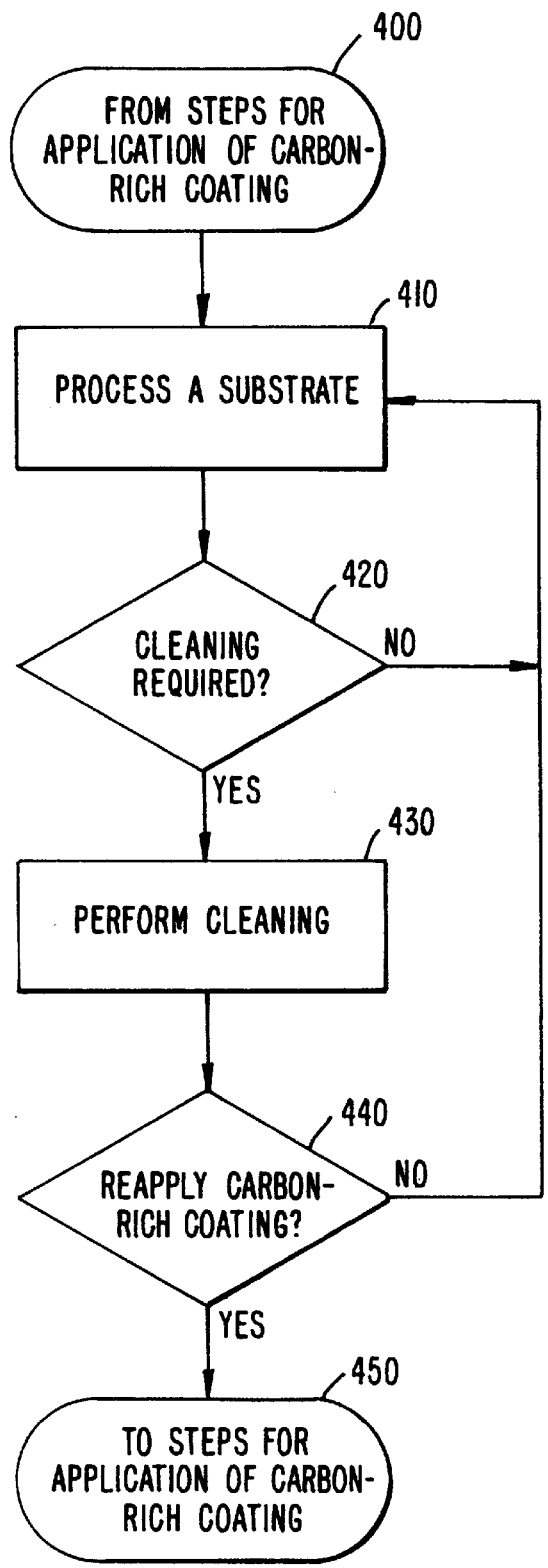
FIG. 4 is a flow chart illustrating the steps performed in processing a substrate using an in situ process according to another method of the present invention.

FIG. 4 illustrates a simplified flow chart of a processing sequence used to demonstrate another embodiment of the present invention. The processing sequence again proceeds from the deposition of carbon-based coating 100 (step 400). In step 410, a substrate is processed. Next, the system's processor determines if the processing chamber requires cleaning (step 420). This decision might be based on physical measurements of the remaining carbon-based coating or on an empirically-determined process recipe (i.e., the steps determined to create optimal substrates). For example, a process recipe might recommend a cleaning after n substrates had been processed. Typically, n is between one and five, but cleaning may occur less frequently depending on process parameters.

In this example, after the processed substrate is removed, the system determines the number of substrates processed since the last cleaning. A counter or register in the processor might be used to determine the number of substrates processed up to that point. If less than n substrates have been processed, step 410 is repeated for another substrate. If n substrates have been processed, the system performs a "dry" cleaning procedure at step 430. In a dry clean, the system performs an in situ cleaning procedure, as previously described. If a vacuum system is employed, this in situ cleaning is done without opening the processing chamber or even breaking the chamber's vacuum seal.

Periodically, a "wet" cleaning may also be performed. A wet clean is generally performed much less frequently than a dry clean, e.g., such as between every 500–2000 substrates. In a wet clean, the chamber's interior surfaces are cleaned manually. For example, in closed vacuum systems, such as the exemplary HDP-CVD system, the wet cleaning procedure of step 430 involves breaking the vacuum seal and opening the system's processing chamber. Accumulated residues are then physically wiped from the chamber's interior surfaces, using a special cloth and cleaning fluids. Processing proceeds after cleaning is completed and the chamber is sealed again.

After the cleaning, the system determines (step 440) whether to apply a fresh coat of carbon-based material. This decision might be based on physical measurements or a process recipe. For example, a process recipe might indicate a new coating is required when the number of processed substrates equals m. If less than m substrates have been processed, step 410 is repeated for another substrate. If m substrates have been processed, the sequence continues to step 450, where the process of applying a fresh coating of carbon-based material is begun. The value of m may be set to one, or to a larger value. Typically, m is greater than or equal to n and is between one and ten. If m is greater than n, it is typically a multiple of n since it is the clean step that is often primarily responsible for etching of the DLC coating. A carbon-based coating is reapplied when the existing carbon-based coating experiences substantial erosion caused by processing operations. This in situ process can be practiced in any processing system capable of creating a plasma, as long as the system is capable of handling the necessary process gases.

The deposition of in situ carbon-based coatings is advantageous for reasons similar to those that commend the diamond and DLC coatings previously described. Further, the substrate processing system need not be disassembled to apply the coating. This avoids downtime, which can be expensive in systems that are ordinarily run continuously. Only minor changes to processing systems currently in use would be required to allow these systems to employ the method of the present invention.

It should be noted that the highest quality DLC exhibits the highest concentration of sp3-hybridized carbon. Such material is deposited when the substrate is subjected to a negative DC bias of several hundred volts. Some current systems are incapable of achieving such voltages, therefore, they may be unable to produce the highest quality DLC. However, it is believed that an RF bias on the substrate may permit the synthesis of high quality DLC in these situations. In any event, such systems will still enjoy advantages over those lacking such a carbon-based coating. The components in such systems may be better protected by the ex situ application of a carbon-based coating.

IV. Experimental Results

Tests were performed to determine the amount of erosion a quartz sidewall (i.e., sidewall 22 in FIG. 1) having no protective coating might experience during normal processing operations in a system such as the exemplary HDP-CVD system previously described. A 5000 substrate burn-in on a quartz sidewall having a 7-turn, 0.25 in. diameter coil (i.e., coiled antenna 26 in FIG. 1) was thus performed in a Centura HDP-CVD system manufactured by Applied Materials, Inc. The sidewall experienced uniform erosion with no localized attack underneath the coils. "Wormhole" attack occurred at the top and bottom of the sidewall. Wormholes are caused by localized OH concentrations, which etch more quickly than the surrounding material. This action forms wormholes (small tunnels) in the component's surface. Wormholes are problematic because such disintegration can lead to crumbling of the component's surface, thereby increasing particulates. Such disintegration also reduces the component's structural integrity. Following the burn-in procedure, the sidewall thickness was measured at 18 locations (6 positions equidistant around the sidewall's circumference with 3 measurements made vertically from the top of the sidewall to the bottom at each location), along with the diameter of the top opening as well as the depth of wormholes. Table 1 summarizes the sidewall thickness data.

TABLE 1

SIDEWALL THICKNESS AFTER BURN-IN

| Position | Top of Sidewall (in.) | Middle of Sidewall (in.) | Bottom of Sidewall (in.) |
|---|---|---|---|
| 1 | 0.200 | 0.110 | 0.140 |
| 2 | 0.200 | 0.110 | 0.140 |

TABLE 1-continued

SIDEWALL THICKNESS AFTER BURN-IN

| Position | Top of Sidewall (in.) | Middle of Sidewall (in.) | Bottom of Sidewall (in.) |
| --- | --- | --- | --- |
| 3 | 0.220 | 0.130 | 0.180 |
| 4 | 0.200 | 0.110 | 0.180 |
| 5 | 0.200 | 0.110 | 0.140 |
| 6 | 0.200 | 0.110 | 0.140 |

The maximum depth of the wormholes was found to be 0.08 in. The top opening of the sidewall also experienced erosion, increasing in diameter from 9.45 in. to 9.54 in.

The original thickness of the sidewall was about 0.3 in. After about 5000 substrates were processed, the wall thickness was reduced to as little as 0.11 in. at the region approximately coinciding with the third coil turn from the top. This region also experiences the highest temperature. From this data it is evident that although etching of the sidewall is very uniform, the quartz sidewall is etched at a substantial rate. The rate of attack is about 0.2 in. for the processing of 5000 substrates (standard gap-fill process, cleaning every four substrates), translating into an etch rate of approximately 1.0 $\mu$m per substrate.

Figure 5:
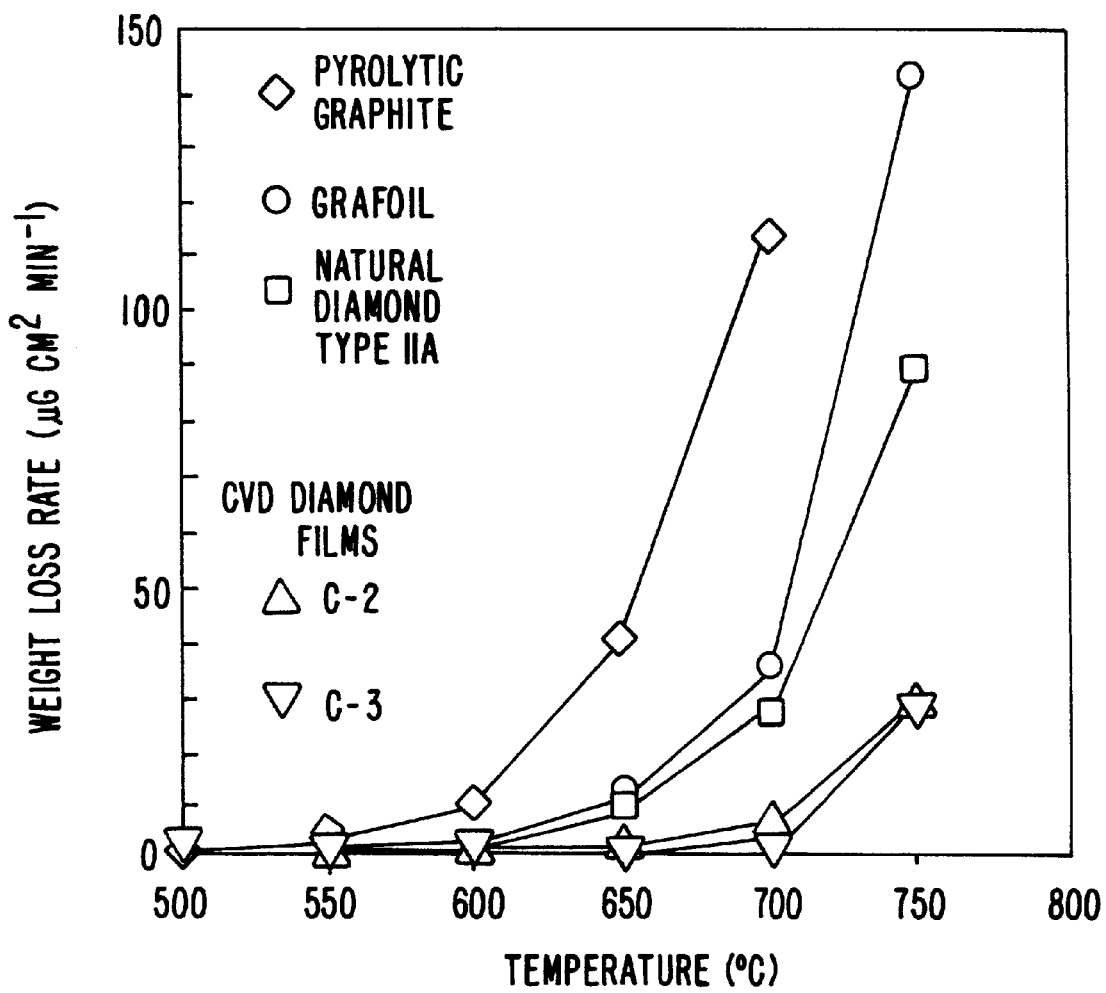
FIG. 5 is a graph showing the effect of temperature on the oxidation rate of diamond as compared with the oxidation rate of graphite.

Experiments were also conducted to determine the durability of components coated with carbon-based materials. Components having diamond coatings according to the present invention proved resistant to chemical attack, including attack by ionized gaseous species. Below temperatures of about 600° C., the components resisted attack by molecular and atomic oxygen, molecular and activated etch gases such as $NF_3$ and $CF_4$, and other process gases commonly used in substrate processing. FIG. 5 shows the effect of temperature on the oxidation rate of diamond as compared with that of graphite (which oxidizes at a higher rate than other carbon-based coatings do). The oxidation rate is used as a metric because an oxidation reaction is the only susceptibility shown by components coated according to the present invention. From this data it is evident that such components can be heated to temperatures in excess of 600° C. in 100% flowing oxygen environments without experiencing oxidation. This is an extreme case, as such conditions are virtually never approached during normal processing. Tests conducted in an atomic oxygen environment display similar results.

Figure 6A:
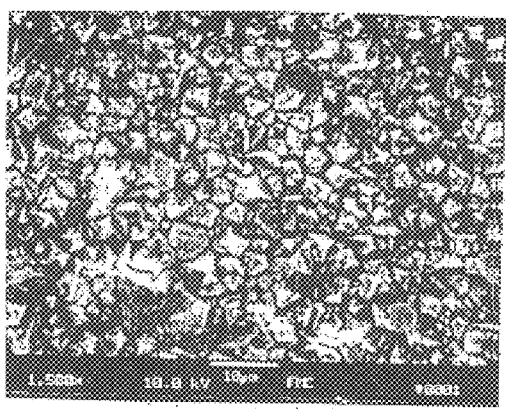
FIG. 6A is a scanning electron micrograph at 1500× magnification showing the surface structure of a diamond film deposited according to one embodiment of the present invention prior to plasma treatment.
Figure 6B:
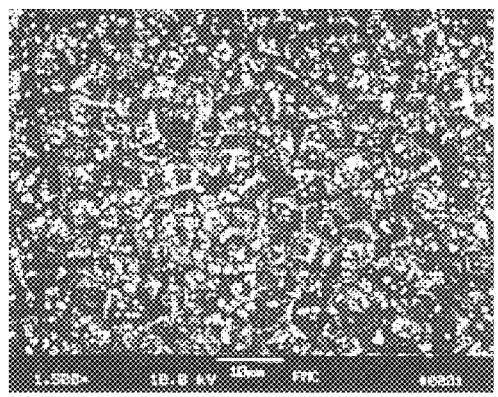
FIG. 6B is a scanning electron micrograph at 1500× magnification showing the effects of an $NF_3$ plasma treatment on the surface structure of the diamond film shown in FIG. 6A.
Figure 6C:
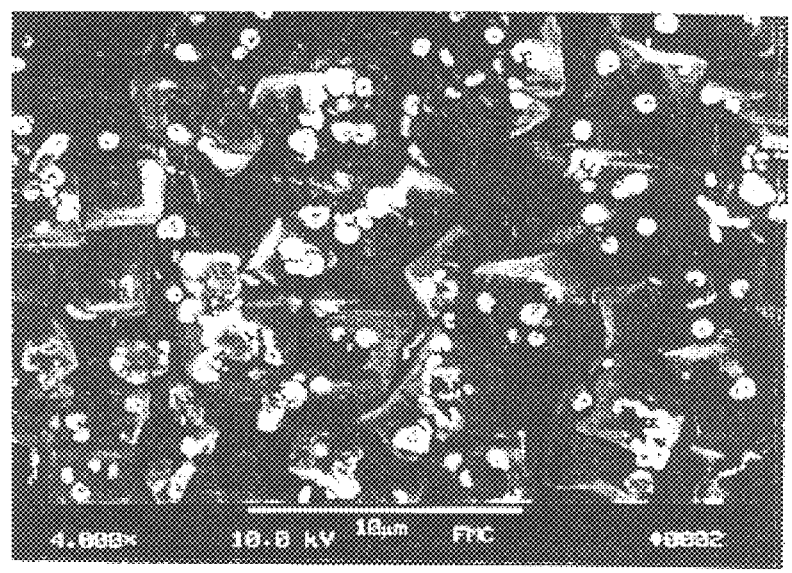
FIG. 6C is a scanning electron micrograph at 4000× magnification showing the effects of an $NF_3$ plasma treatment on the surface structure of the diamond film shown in FIG. 6A.

FIG. 6A shows the surface structure of a diamond coating according to the present invention, which was the subject of another experiment. The coating in the figure was deposited on a silicon coupon to a thickness of approximately 5 $\mu$m and is shown at 1500× magnification. The coated silicon coupon was placed on a silicon substrate, which was then held in place by an electrostatic chuck. FIG. 6B shows the coating after 10 hours exposure to a $CF_4/O_2$ plasma with bias RF power of approximately 4000 Watts and source RF power of approximately 2500 Watts. Magnification is again 1500×. FIG. 6C illustrates a scanning electron micrograph showing a higher magnification view (4000×) of the same sample. The coating's surface structure shows no evidence of etching after exposure to the $CF_4/O_2$ plasma in either photomicrograph. The white precipitates seen in the photomicrographs of FIGS. 6B and 6C are aluminum fluoride deposits resulting from the reaction of the aluminum chamber walls with the fluorine in the plasma. Given the foregoing results, it is believed that such components will have virtually limitless lifetimes. At the least, these components are shifted into the category of nonconsumables (defined as components having a lifetime of six months or more during normal use).

The method of the present invention is not intended to be limited in any manner by the specific parameters set forth in the above experiments. A person of ordinary skill in the art will realize that different processing conditions and coating sources can be used without departing from the spirit of the invention. For example, any one of the diamond deposition methods mentioned (or others) may be used. As noted above, the method may be carried out on separate components in a dedicated diamond deposition system, or an in situ process may be employed.

Having fully described several embodiments of the present invention, many other equivalent or alternative types of carbon-based protective coatings and methods of their application according to the present invention will be apparent to those skilled in the art. These equivalents and alternatives are intended to be included within the scope of the present invention.

What is claimed is:

1. A semiconductor substrate processing system comprising:

a housing, said housing including a sidewall and having an interior surface defining a processing chamber, wherein said interior surface is at least partially coated with a diamond-like carbon coating to a desired thickness that is at least about 0.5 $\mu$m and said diamond-like carbon coating coats a portion of said interior surface of said sidewall.

2. A semiconductor substrate processing system comprising:

a housing, said housing including a sidewall and having an interior surface defining a processing chamber, wherein said interior surface is at least partially coated with a diamond-like carbon coating to a predetermined thickness, wherein said predetermined thickness is between about 0.5 $\mu$m and about 50 $\mu$m and said diamond-like carbon coating coats a portion of said interior surface of said sidewall.

3. A semiconductor substrate processing system comprising:

a housing, said housing including a sidewall and having an interior surface defining a processing chamber, wherein said interior surface is at least partially coated with a diamond-like carbon coating to a predetermined thickness, wherein said predetermined thickness is between about 0.5 $\mu$m and about 10 $\mu$m and said diamond-like carbon coating coats a portion of said interior surface of said sidewall.

4. A semiconductor substrate processing system comprising:

a housing, said housing including a sidewall and having an interior surface defining a processing chamber, wherein said interior surface is at least partially coated with a diamond-like carbon coating to a predetermined thickness, wherein said predetermined thickness is between about 0.5 $\mu$m and about 2 $\mu$m and said diamond-like carbon coating coats a portion of said interior surface of said sidewall.

5. The semiconductor substrate processing system of claim 1, wherein said diamond-like carbon coating is applied using an in situ process, and said in situ process is controlled by a processing element.

6. The semiconductor substrate processing system of claim 5, wherein said in situ process comprises:

evacuating a process gas from said processing chamber;

introducing a coating process gas for creating said diamond-like carbon coating;

forming a plasma from said coating process gas, to deposit said diamond-like carbon coating on said interior surface of said processing chamber; and evacuating said coating process gas from said processing chamber.

7. The semiconductor substrate processing system of claim 6, wherein said coating process gas comprises hydrogen and methane.

8. The semiconductor substrate processing system of claim 6, wherein RF power is applied at between about 3000 Watts to 5000 Watts to form said plasma.

9. The semiconductor substrate processing system of claim 6, wherein said diamond-like carbon coating is deposited at a temperature of between about 200° C. to 250° C.

10. The semiconductor substrate processing system of claim 6, wherein said diamond-like carbon coating is deposited at a pressure of between about 5 torr to 50 torr.

11. A semiconductor substrate processing system comprising:

a housing, said housing including a sidewall and having an interior surface defining a processing chamber, wherein said interior surface is at least partially coated with a diamond-like carbon coating to a predetermined thickness, wherein said predetermined thickness is between about 0.5 $\mu$m and about 2 $\mu$m and said diamond-like carbon coating coats a portion of said interior surface of said sidewall, wherein said diamond-like carbon coating is applied using an in situ process that is controlled by a processing element, said in situ process comprising, evacuating a process gas from said processing chamber;

introducing a coating process gas for creating said diamond-like carbon coating;

forming a plasma from said coating process gas, to deposit said diamond-like carbon coating on said interior surface of said processing chamber; and evacuating said coating process gas from said processing chamber.

12. A method for operating a semiconductor substrate processing system having a housing, said housing including a sidewall and having an interior surface defining a processing chamber, said method comprising:

coating at least a portion of said interior surface, including at least a portion of said sidewall, with a diamond-like carbon coating, wherein said diamond-like carbon coating is deposited to a predetermined thickness; and thereafter, processing one or more substrates situated within said housing.

13. A method for operating a semiconductor substrate processing system having a housing with an interior surface defining a processing chamber, said method comprising:

coating at least a portion of said interior surface with a diamond-like carbon coating, wherein said diamond-like carbon coating is deposited to a predetermined thickness between about 0.5 $\mu$m and about 50 $\mu$m;

thereafter, processing one or more substrates situated within said housing; and wherein said coating step and said processing step are repeated iteratively.

14. The method of claim 13, wherein said coating step comprises:

evacuating process gases from said processing chamber;

introducing at least one coating process gas for depositing said diamond-like carbon coating;

forming a plasma from said coating process gas, to deposit said diamond-like carbon coating on said inner surface of said processing chamber; and evacuating said coating process gas from said processing chamber.

15. The method of claim 13, wherein said processing step comprises:

processing n substrates;

thereafter, performing a cleaning step to clean said interior surface of said processing chamber; and repeating said steps of processing n substrates and performing a cleaning step, until m substrates have been processed.

16. The method of claim 15, wherein m is greater than or equal to n and between 1 and 20.

17. The method of claim 13, wherein said processing step comprises:

processing n substrates;

thereafter, performing a cleaning step to clean said interior surface of said processing chamber;

thereafter, measuring a thickness of said diamond-like carbon coating that remains; and iterating said processing step, said cleaning step and said measuring step until a minimum thickness of said diamond-like carbon coating is reached.

18. The method of claim 17, wherein said minimum thickness is between about 0.1 $\mu$m and about 10 $\mu$m.

19. The method of claim 17, wherein said minimum thickness is between about 0.5 $\mu$m and about 2 $\mu$m.

20. A semiconductor substrate processing system comprising:

a housing, having an interior surface defining a processing chamber, said interior surface being at least partially coated with a diamond coating, wherein said diamond coating is deposited to a desired thickness that is at least about 0.5 $\mu$m.

21. A semiconductor substrate processing system comprising:

a housing, having an interior surface defining a processing chamber, said interior surface being at least partially coated with a diamond coating, wherein said diamond coating is deposited to a predetermined thickness wherein said predetermined thickness is between about 1 $\mu$m and about 5 $\mu$m.

22. A semiconductor substrate processing system comprising:

a housing, having an interior surface defining a processing chamber, said interior surface being at least partially coated with a diamond coating, wherein said diamond coating is deposited to a predetermined thickness, wherein said predetermined thickness is between about 2 $\mu$m and about 5 $\mu$m.

23. The substrate processing system of claim 20, wherein said diamond coating is deposited using an in situ process.

24. A substrate processing system for processing a substrate comprising:

a housing, having an interior surface defining a processing chamber, said interior surface being at least partially coated with a carbon-based coating, wherein said housing includes a ceiling electrode, said interior surface consisting in part of a surface of said ceiling electrode, said surface of said ceiling electrode having a diamond coating between about 1 μm and about 50 μm in thickness; and a substrate holder, located within said housing, for holding said substrate during processing.

25. A method for processing substrates in a substrate processing system having a housing with an interior surface defining a processing chamber, said method comprising:

coating at least a portion of said interior surface with a diamond coating, wherein said diamond coating is deposited to a predetermined thickness; and thereafter, processing one or more substrates situated within said housing.

26. The method of claim 25, wherein said predetermined thickness is between about 1 μm and about 50 μm.

27. The method of claim 26, wherein said coating step and said processing step are repeated iteratively.

28. The method of claim 27, wherein said coating step comprises:

evacuating process gases from said processing chamber;

introducing at least one coating process gas for depositing said diamond coating;

forming a plasma from said coating process gas, to deposit said diamond coating on said inner surface of said processing chamber; and evacuating said coating process gas from said processing chamber.

29. The method of claim 27, wherein said processing step comprises:

processing n substrates;

thereafter, performing a cleaning step to clean said interior surface of said processing chamber; and repeating said steps of processing n substrates and performing a cleaning step, until m substrates have been processed.

30. The method of claim 29, wherein m is greater than or equal to n and between 1 and 20.

31. The method of claim 27, wherein said processing step comprises:

processing n substrates;

thereafter, performing a cleaning step to clean said interior surface of said processing chamber;

thereafter, measuring a thickness of said diamond coating that remains; and iterating said processing step, said cleaning step and said measuring step until a minimum thickness of said diamond coating is reached.

32. The method of claim 31, wherein said minimum thickness is between about 0.1 μm and about 10 μm.

33. The method of claim 31, wherein said minimum thickness is between about 0.5 μm and about 2 μm.

34. A substrate processing system comprising:

a housing, having an interior surface defining a processing chamber;

a pedestal, located within said housing, for holding a substrate during processing;

a vacuum pump for evacuating said processing chamber;

a gas distribution system for introducing at least one process gas and a coating process gas into said processing chamber;

a plasma generation system for creating a plasma within said processing chamber;

a controller for controlling said vacuum pump, said gas distribution system and said plasma generation system; and a memory coupled to said controller comprising a computer readable medium having a computer readable program embodied therein for directing operation of said substrate processing system, said computer readable program comprising:

a first set of computer instructions for controlling said gas distribution system to evacuate said at least one process gas from said processing chamber;

a second set of computer instructions for controlling said gas distribution system to introduce said coating process gas for creating a carbon-based coating;

a third set of computer instructions for controlling said plasma generation system to form a plasma from said coating process gas, to deposit said carbon-based coating on said inner surface of said processing chamber, wherein said carbon-based coating comprises a diamond coating; and a fourth set of computer instructions for controlling said gas distribution system to evacuate said coating process gas from said processing chamber.

35. A substrate processing system comprising:

a housing, having an interior surface defining a processing chamber;

a pedestal, located within said housing, for holding a substrate during processing;

a vacuum pump for evacuating said processing chamber;

a gas distribution system for introducing at least one process gas and a coating process gas into said processing chamber;

a plasma generation system for creating a plasma within said processing chamber;

a controller for controlling said vacuum pump, said gas distribution system and said plasma generation system; and a memory coupled to said controller comprising a computer readable medium having a computer readable program embodied therein for directing operation of said substrate processing system, said computer readable program comprising:

a first set of computer instructions for controlling said gas distribution system to evacuate said at least one process gas from said processing chamber;

a second set of computer instructions for controlling said gas distribution system to introduce said coating process gas for creating a carbon-based coating;

a third set of computer instructions for controlling said plasma generation system to form a plasma from said coating process gas, to deposit said carbon-based coating on said inner surface of said processing chamber, wherein said carbon-based coating comprises a diamond-like carbon coating; and a fourth set of computer instructions for controlling said gas distribution system to evacuate said coating process gas from said processing chamber.

36. The method of claim 12, wherein said predetermined thickness is between about 0.5 μm and about 50 μm.

37. The semiconductor substrate processing system of claim 2, wherein said diamond-like carbon coating is applied using an in situ process, and said in situ process is controlled by a processing element.

38. The semiconductor substrate processing system of claim 37, wherein said in situ process comprises:

evacuating a process gas from said processing chamber;

introducing a coating process gas for creating said diamond-like carbon coating;

forming a plasma from said coating process gas, to deposit said diamond-like carbon coating on said interior surface of said processing chamber; and evacuating said coating process gas from said processing chamber.

39. The semiconductor substrate processing system of claim 38, wherein said coating process gas comprises hydrogen and methane.

40. The method of claim 12, wherein said coating step comprises:

evacuating process gases from said processing chamber;

introducing a coating process gas for depositing said diamond-like carbon coating;

forming a plasma from said coating process gas, to deposit said diamond-like carbon coating on said inner surface of said processing chamber; and evacuating said coating process gas from said processing chamber.

41. A method for operating a semiconductor substrate processing system having a housing with an interior surface defining a processing chamber, said method comprising:

introducing a coating process gas into said housing to coat, to a predetermined thickness, at least a portion of said interior surface with a diamond-like carbon coating;

evacuating said coating process gas from said processing chamber; and thereafter, processing one or more substrates within said housing.

42. The substrate processing system of claim 21, wherein said diamond coating is deposited using an in situ process.

43. The method of claim 41, wherein said diamond-like carbon coating is deposited from a plasma of said coating process gas.

* * * * *